(12) United States Patent
Pan et al.

(10) Patent No.: US 7,057,949 B1
(45) Date of Patent: Jun. 6, 2006

(54) METHOD AND APPARATUS FOR PRE-CHARGING NEGATIVE PUMP MOS REGULATION CAPACITORS

(75) Inventors: Feng Pan, Richmond, CA (US); Weng Fook Lee, Penang (ML); Edward V. Bautista, Jr.; Santosh K. Yachareni, both of Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1123 days.

(21) Appl. No.: 10/050,342

(22) Filed: Jan. 16, 2002

(51) Int. Cl.
*G11C 7/00* (2006.01)

(52) U.S. Cl. ......................................... 365/203; 365/218
(58) Field of Classification Search ................. 365/218, 365/189.09, 203, 204, 185.33, 191, 207
See application file for complete search history.

(56) References Cited

U.S. PATENT DOCUMENTS

| 5,282,170 | A | * | 1/1994 | Van Buskirk et al. | .. 365/185.33 |
| 5,291,446 | A | * | 3/1994 | Van Buskirk et al. | ...... 327/540 |
| 5,962,887 | A | | 10/1999 | Manning et al. | |
| 5,973,979 | A | | 10/1999 | Chang et al. | |
| 6,023,427 | A | * | 2/2000 | Lakhani et al. | ........ 365/185.33 |
| 6,028,473 | A | | 2/2000 | Kamei et al. | |
| 6,181,629 | B1 | | 1/2001 | Ogura | |
| 6,208,124 | B1 | | 3/2001 | Fuchigami et al. | |

OTHER PUBLICATIONS

US 5,612,921, 3/1997, Chang et al. (withdrawn)

* cited by examiner

*Primary Examiner*—David Nelms
*Assistant Examiner*—Thong Le
(74) *Attorney, Agent, or Firm*—Esachweiler & Associates, LLC

(57) ABSTRACT

Methods and apparatus are disclosed for erasing a core memory cell using a negative gate voltage in a semiconductor memory device, wherein negative pump MOS regulation capacitors are pre-charged according to a pre-charge signal during a core cell erase operation. A negative voltage pump is then regulated using the pre-charged negative pump MOS regulation capacitors to provide the negative gate voltage. Apparatus is disclosed for pre-charging negative pump MOS regulation capacitors during a core cell erase operation in a memory device, which comprises a switch connected between a reference voltage and the negative pump MOS regulation capacitors, and a pre-charge control circuit providing a pre-charge signal to the switch to selectively connect the reference voltage to the negative pump MOS regulation capacitors for pre-charging thereof in an erase operation.

16 Claims, 5 Drawing Sheets

METHOD AND APPARATUS FOR PRE-CHARGING NEGATIVE PUMP MOS REGULATION CAPACITORS

FIELD OF INVENTION

The present invention relates generally to memory systems and more particularly to apparatus and methodologies for pre-charging negative pump regulation capacitors during erase operations for generating a negative gate voltage.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. More recently, dual bit memory cell architectures have been introduced, wherein each cell can store two bits of data. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry, whereby such operations may be performed on the cells within a specific byte or word. The individual memory cells typically include a semiconductor structure adapted for storing a bit of data. For instance, many conventional memory cells include a metal oxide semiconductor (MOS) device, such as a transistor in which a binary piece of information may be retained in the form of electrical charge. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell. In an erase or program operation the voltages are applied so as to cause a change in charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a type of electronic memory media which can be rewritten and hold its content without power. Flash memory devices generally have life spans from 100K to 10 MEG write cycles. Unlike dynamic random access memory (DRAM) and static random access memory (SRAM) memory chips, in which a single byte can be erased, flash memory is typically erased and written in fixed multi-bit blocks or sectors. Conventional flash memories are constructed in a cell structure wherein a single bit of information is stored in each flash memory cell. In such single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a wordline associated with a row of such cells to form sectors of such cells in a typical NOR configuration. In addition, the drain regions of the cells are connected together by a conductive bitline. The channel of the cell conducts current between the source and the drain in accordance with an electric field developed in the channel by the stacked gate structure. In the NOR configuration, each drain terminal of the transistors within a single column is connected to the same bitline. In addition, each flash cell associated with a given bit line has its stacked gate terminal coupled to a different wordline, while all the flash cells in the array have their source terminals coupled to a common source terminal. In operation, individual flash cells are addressed via the respective bitline and wordline using peripheral decoder and control circuitry for programming (writing), reading or erasing functions.

Programming a flash memory cell is typically done by channel hot electron (CHE) by grounding the source region, applying a relatively high positive voltage to the control gate and applying a moderate voltage to the drain to generate high energy or hot electrons, which accumulate in the floating gate until the effective threshold voltage of the cell rises to a programmed threshold voltage, which is sufficient to inhibit current flow through the channel region during any subsequent read mode operation. Typically, in the read mode, a relatively low positive voltage is applied to the drain, a moderate voltage is applied to the control gate and the source is grounded. The magnitude of the resulting current can be sensed in order to ascertain whether the cell is programmed or erased.

Flash memory core cells are typically erased in blocks or sectors of many such cells. Negative gate erase operation involves providing a moderate positive voltage (e.g., 5V or VCC) to the source, floating the drain, grounding the substrate, and applying a negative voltage (e.g., −8 volts) to the gate. Subsequently, an erase verify operation is performed to ensure proper erasure of each of the core cells in the sector. Thereafter, soft programming is employed, wherein a small amount of charge is injected into the cell to rectify or mitigate over-erased conditions resulting from repeated erasure of the cell. The amount of charge injected during the soft programming is controlled so as not to over-program the cell, so that it passes erase verify even after a soft program verify operation, which is performed right after the soft programming operation.

During erase operations, negative voltages are applied to the gate of the core cell or cells of interest. The negative gate voltages are commonly applied using a regulated negative charge pump employing feedback to regulate the gate voltages. A voltage derived by dividing the output voltage of the pump is compared with a reference voltage, and the comparison is used to regulate the voltage applied to the cell gate. Capacitive voltage dividers are often used to divide the negative pump output voltage for such feedback purposes, wherein capacitive dividers utilize less power than resistive dividers. Metal capacitors have been previously employed in such capacitive regulator voltage divider applications. However, as semiconductor memory device densities increase, it is desirable to reduce the physical size of the components in the negative pump and associated regulation circuitry. Thus, it is desirable to provide methods and apparatus for providing negative gate voltages to core cells during erase operations, by which the size of the negative voltage circuitry can be reduced.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to methods and apparatus for providing negative voltages to the gates of core cells during erase operations, which advantageously allow for using metal-oxide-semiconductor (MOS) type capacitors for capacitive regulation circuitry in association with a negative charge pump. MOS type capacitors typically occupy less space than the metal capacitors commonly employed in regulator circuit voltage dividers. However, while using MOS capacitors provides for reduction in the physical area required for negative regulation capacitors, the MOS type capacitors may need to be pre-charged prior to beginning closed-loop regulation of a negative charge pump voltage. For instance, the capacitance of such MOS capacitors typically varies as a function of applied voltage, due to the semiconductor structure of such devices. The present invention provides for pre-charging the negative pump regulation capacitors to a known value by selectively connecting the capacitors to a reference voltage before beginning active regulation. In this manner, the smaller, space-saving MOS type capacitors can be employed in regulating the negative charge pump for providing negative erase gate voltages in a flash memory device.

One aspect of the invention provides methodologies for erasing core memory cells, wherein a pre-charge signal is generated at or near the beginning of an erase operation, and the negative pump regulation capacitors are pre-charged according to the pre-charge signal. Thereafter, the negative pump voltage is regulated using the pre-charged negative pump regulation capacitors, thus allowing erasure of one or more core memory cells by applying a negative gate voltage to the core memory cell using the regulated negative pump voltage. The pre-charge signal may be a pulse having a duration sufficient to ensure charging of the capacitors to a known value, for example, such as about 160 ns. The pulse signal may be applied to a gating transistor type switch, which selectively connects a voltage reference to the capacitive voltage divider for a known time, after which active regulation of the negative pump can begin.

Another aspect of the invention provides a method of providing a negative gate voltage during a core memory cell erase operation, which involves generating a pre-charge signal, pre-charging negative pump regulation capacitors according to the pre-charge signal, regulating a negative pump voltage using the pre-charged negative pump regulation capacitors, and providing a negative gate voltage to the core memory cell using the regulated negative pump voltage. Still another aspect of the invention provides apparatus for pre-charging negative pump regulation capacitors during a core cell erase operation in a memory device. The apparatus comprises a switch connected between a reference voltage and the negative pump regulation capacitors, and a pre-charge control circuit providing a pre-charge signal to the switch, where the switch is operative to selectively connect the reference voltage to the negative pump regulation capacitors according to the pre-charge signal.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention relates to methods and apparatus applicable to erase operations in a flash memory device, wherein negative voltages are applied to core cell gates. MOS type capacitors can be employed in a negative pump regulation circuit to create a capacitive voltage divider for closed-loop feedback regulation, wherein the negative regulation capacitors are pre-charged to a known value prior to active regulation. This pre-charging facilitates the use of MOS type capacitors in the regulation circuit, by which space savings can be accomplished in flash memory devices. Although illustrated and described hereinafter in association with single-bit stacked-gate type memory cells and devices, the various aspects of the present invention find utility in association with various different memory device architectures and types (e.g., such as dual-bit devices) in which negative voltage pumps are regulated to provide erase gate voltages.

Figure 1:
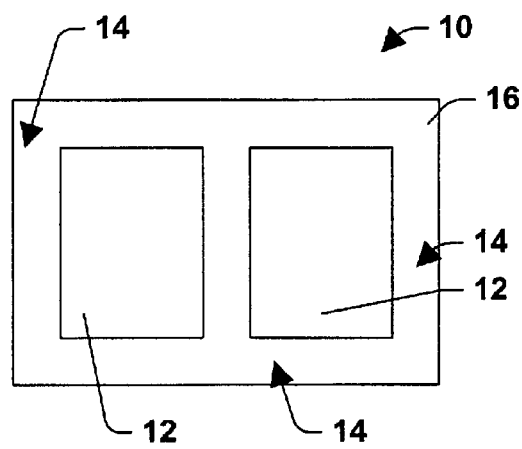
FIG. 1 is a plan view schematically illustrating an exemplary layout of a memory device.
Figure 2:
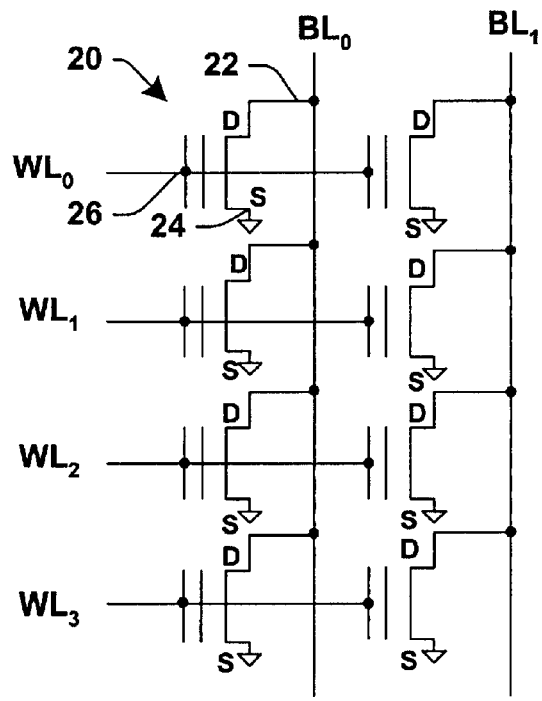
FIG. 2 is a schematic diagram illustrating an exemplary core portion of a memory circuit.

Referring initially to FIGS. 1 and 2, semiconductor memory devices typically include multiple individual components formed on or within a substrate. Such devices often comprise a high density section and a low density section. For example, as illustrated in FIG. 1, a flash memory device 10 comprises one or more high density core regions 12 and a low density peripheral portion 14 on a single substrate 16. The high density core regions 12 typically include at least one M×N array of individually addressable, substantially identical, memory cells and the low density peripheral portion 14 typically includes input/output (I/O) circuitry and circuitry for selectively addressing the individual cells (such as decoders for connecting the source, gate and drain of selected cells to predetermined voltages or impedances to enable designated operations of the cell such as programming, reading or erasing).

The memory cells within the core portion 12 are coupled together in a circuit configuration, such as a NOR configuration illustrated in FIG. 2. Each memory cell 20 has a drain 22, a source 24, and a stacked gate 26. Each stacked gate 26 is coupled to a wordline ($WL_0$, $WL_1$, ..., $WL_N$) while each drain 22 is coupled to a bitline ($BL_0$, $BL_1$, ..., $BL_N$). In addition, each source 24 is coupled to ground. Using peripheral decoder and control circuitry (not shown), each memory cell 20 may be addressed for programming, reading, erasing, soft programming, and/or verify functions.

Figure 3:
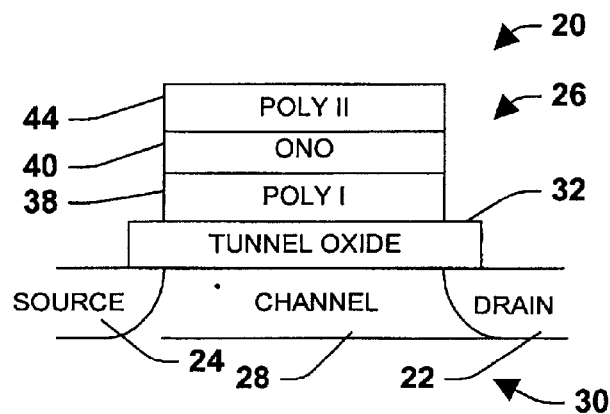
FIG. 3 is a partial cross-sectional view of a conventional stacked gate memory cell.

FIG. 3 illustrates a cross-sectional view of a single-bit (e.g., stacked gate) memory cell 20, such as may be found in the core regions 12 of FIGS. 1 and 2. Although a single-bit type cell will be described briefly below for purposes of illustration, it should be understood that the present invention is equally applicable to dual bit cells and other flash memory cell architectures, and such alternatives are contemplated as falling within the scope of the present invention. Such a memory cell 20 typically includes the source 24, the drain 22 and a channel 28 in a substrate 30, and the stacked gate structure 26 overlying the channel 28.

The stacked gate 26 includes a thin gate dielectric layer 32 (commonly referred to as the tunnel oxide) formed on the surface of the substrate 30. The tunnel oxide layer 32 coats a portion of the top surface of the silicon substrate 30 and serves to support an array of different layers directly over the channel 28. The stacked gate 26 includes a lower most or first film layer 38, such as doped polycrystalline silicon (polysilicon or poly I) layer which serves as a floating gate 38 that overlies the tunnel oxide 32. Note that the various portions of the transistor 20 highlighted above are not drawn to scale in FIG. 3, but rather are illustrated as such for ease of illustration and to facilitate an understanding of the device operation.

Above the poly I layer 38 is an interpoly dielectric layer 40. The interpoly dielectric layer 40 is often a multilayer insulator such as an oxide-nitride-oxide (ONO) layer having two oxide layers sandwiching a nitride layer, or alternatively can be another dielectric layer such as tantalum pentoxide. Finally, the stacked gate 26 includes an upper or second polysilicon layer (poly II) 44 which serves as a polysilicon control gate overlying the ONO layer 40. The control gates 26 of the respective cells 20 that are formed in a given row share a common wordline (WL) associated with the row of cells (see, e.g., FIG. 2). In addition, as highlighted above, the drain regions 22 of the respective cells in a vertical column are connected together by a conductive bitline (BL). The channel 28 of the cell 20 conducts current between the source 24 and the drain 22 in accordance with an electric field developed in the channel 28 by the stacked gate structure 26.

The memory cell 20 is programmed by applying a relatively high voltage to the control gate 38 and a moderately high voltage to the drain 22 in order to produce "hot" (high energy) electrons in the channel 28 near the drain 22. The hot electrons accelerate across the tunnel oxide 32 and into the floating gate 34, which become trapped in the floating gate 38 because the floating gate 38 is surrounded by insulators (the interpoly dielectric 40 and the tunnel oxide 32). As a result of the trapped electrons, a threshold voltage of the memory cell 20 increases. This change in the threshold voltage (and thereby the channel conductance) of the memory cell 20 created by the trapped electrons is what causes the memory cell 20 to be programmed.

To read the memory cell 20, a predetermined gate voltage greater than the threshold voltage of an unprogrammed memory cell, but less than the threshold voltage of a programmed memory cell, is applied to the control gate 26. If the memory cell 20 conducts (e.g., a sensed current in the cell exceeds a minimum value), then the memory cell 20 has not been programmed (the memory cell 20 is therefore at a first logic state, e.g., a one "1"). Conversely, if the memory cell 20 does not conduct (e.g., the current through the cell does not exceed a threshold value), then the memory cell 20 has been programmed (the memory cell 20 is therefore at a second logic state, e.g., a zero "0"). Thus, each memory cell 20 may be read in order to determine whether it has been programmed (and therefore identify the logic state of the data in the memory cell 20).

In order to erase the memory cell 20, a relatively high voltage is applied to the source 24 and the gate 26 is held at a negative voltage, while the drain 22 is allowed to float. Under these conditions, a strong electric field is developed across the tunnel oxide 32 between the floating gate 38 and the source region 24. The electrons that are trapped in the floating gate 38 flow toward and cluster at the portion of the floating gate 38 overlying the source region 24 and are extracted from the floating gate 38 and into the source region 22 by way of Fowler-Nordheim tunneling through the tunnel oxide 32. Consequently, as the electrons are removed from the floating gate 38, the memory cell 20 is erased. It is thus seen that appropriate voltages must be applied to the various terminals (e.g., source, drain, and gate) of the cells 20 in the memory device 10 in order to perform various operations (e.g., erase, erase verify, program, read, etc.) associated with the device 10. In particular, negative gate voltages are needed to erase the memory cells 20, which can be provided by a negative charge pump circuit, as illustrated and described in greater detail hereinafter.

Figure 4:
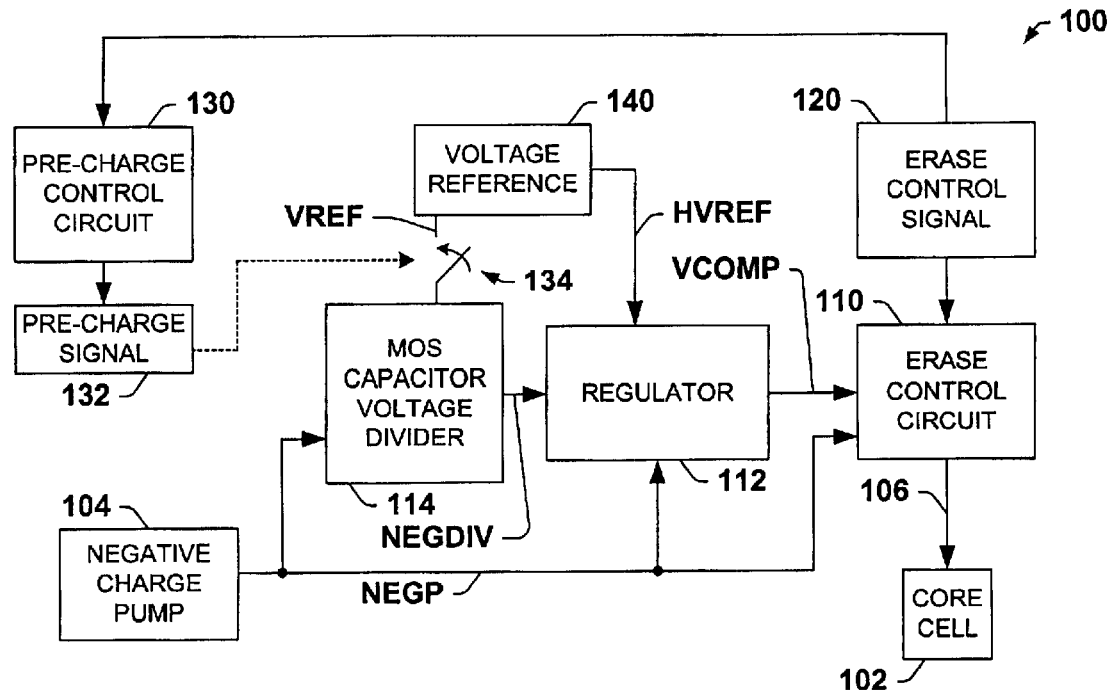
FIG. 4 is a schematic diagram illustrating an exemplary circuit for erasing one or more core memory cells having a pre-charge control circuit for charging MOS type capacitors in a voltage divider in accordance with an aspect of the present invention.

Referring now to FIG. 4, the invention finds application in association with a regulated negative voltage source circuit 100, which may be used to provide negative voltages to the gate of a core memory cell 102 during erase operations. The circuit 100 may be a part of the exemplary flash memory device 10 of FIG. 1 above, for example, in the peripheral portion 14 of the substrate 16. The circuit 100 comprises a negative charge pump 104 providing a negative voltage NEGP (e.g., about −8 volts) for use in providing erase gate voltage 106 for the cell 102 via an erase control circuit 110, as well as to a regulator circuit 112 and a voltage divider 114. As illustrated and described below with respect to FIG. 5, the voltage divider 114 may comprise two series connected MOS type capacitors used to divide the negative voltage NEGP in order to provide regulation feedback to the regulator 112.

During erase operations, the erase control circuit 110 provides the voltage 106 according to an erase control signal 120, which is also provided to a pre-charge control circuit 130 in accordance with the invention. The pre-charge control circuit 130 generates a pre-charge signal 132 according to the erase control signal 120, and the pre-charge signal 132 is used to control a switch 134 to selectively connect a voltage reference 140 with the capacitor voltage divider 114. Connection of the voltage reference 140 allows the capacitors (e.g., MOS or other type capacitors) in the voltage divider 114 to be charged to a known value. Moreover, where the divider 114 comprises MOS capacitors, it will be appreciated that such charging via reference the 140 and the switch 134 provides a known capacitance value to begin regulated operation of the circuit 100. For instance, the capacitors can be charged to a voltage sufficient to ensure stable operation of the circuit 100 during closed-loop regulation, such as a voltage sufficiently distant from the "V" portion of a typical MOS capacitor capacitance vs. voltage curve. The provision of MOS type capacitors, in turn, facilitates space savings in the divider 114 of the circuit 100.

Once the capacitors in the divider network 114 have been charged to a known value, the switch 134 disconnects the voltage reference 140 from the divider 114, and the negative charge pump 104 and the regulator 112 may begin closed-loop regulated operation. During regulation, the negative voltage NEGP is divided in the voltage divider 114 to produce a divided voltage NEGDIV. The regulator 112 compares the divided voltage NEGDIV to a voltage signal HVREF from the voltage reference 140, which is based on the value of the VREF signal (e.g., such as where HVREF is about one half VREF). Based on the comparison, the regulator 112 provides a compensation signal VCOMP to the erase control circuit, by which the value of the voltage NEGP is regulated. In this manner, the appropriate negative gate voltage 106 is provided to the core cell 102 during erase operations in the circuit 100.

Figure 5:
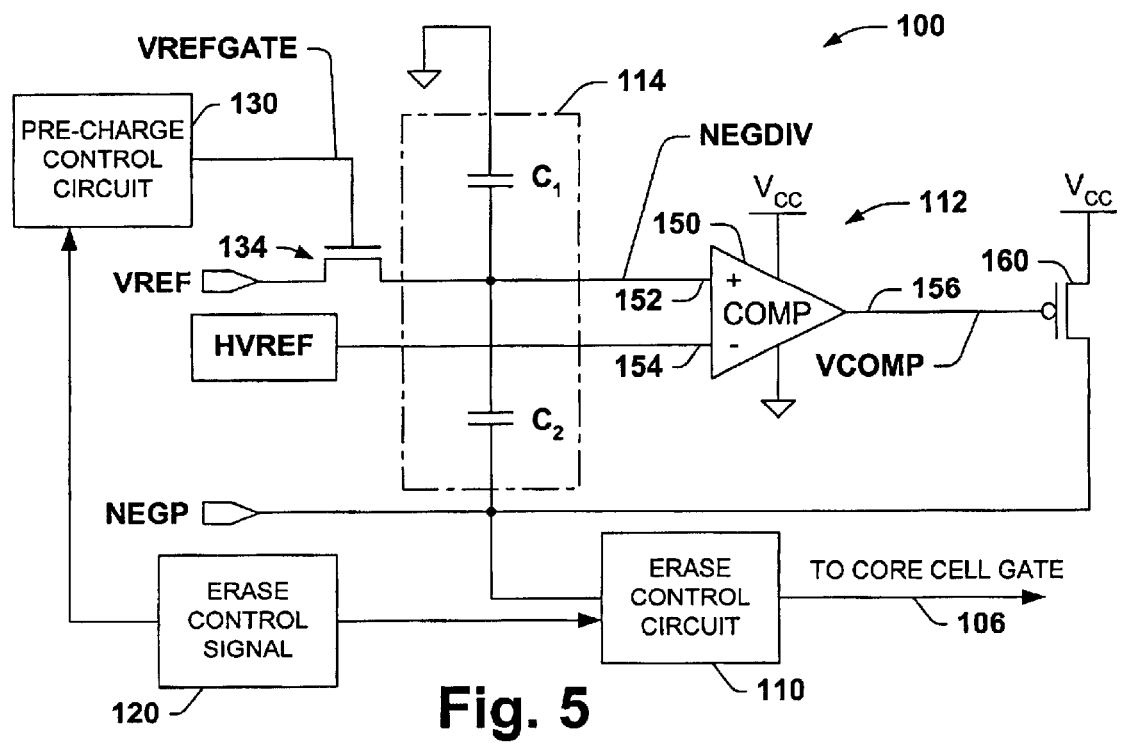
FIG. 5 is a simplified schematic diagram illustrating an exemplary negative regulator circuit for a charge pump, having a MOS capacitor divider network in accordance with the invention.

Referring also to FIG. 5, the capacitive voltage divider network 114 comprises first and second MOS type capacitors $C_1$, and $C_2$, wherein $C_1$ is connected between ground and NEGDIV, and $C_2$ is connected between NEGDIV and NEGP. The regulator 112 comprises a comparator 150 with a positive terminal 152 connected to NEGDIV and a negative terminal connected to HVREF. The comparator 150 compares NEGDIV and HVREF during regulated operation, and provides VCOMP at an output terminal 156 so as to regulate the negative pump voltage NEGP at an appropriate value (e.g., about −8 volts). The VCOMP signal is used to control a transistor 160 for biasing the negative voltage NEGP toward a positive supply $V_{cc}$ in a controlled fashion, in order to regulate the negative voltage NEGP. The transistor 160 may comprise part of the erase control circuit 110, or may be separate, and the erase control circuit 110 provides the regulated voltage 106 to the core cell gate during an erase operation. Prior to regulated operation, the reference voltage VREF is provided to the positive terminal 152 of the comparator 150, as well as to the capacitors $C_1$ and $C_2$, in order to pre-charge the capacitors $C_1$ and $C_2$ to known values, such that stable regulation operation can commence when the negative charge pump 104 (FIG. 4) pumps and the regulator 112 begins to operate. Pre-charging the MOS capacitors to VREF rather than to zero saves MOS capacitor area.

Figure 6:
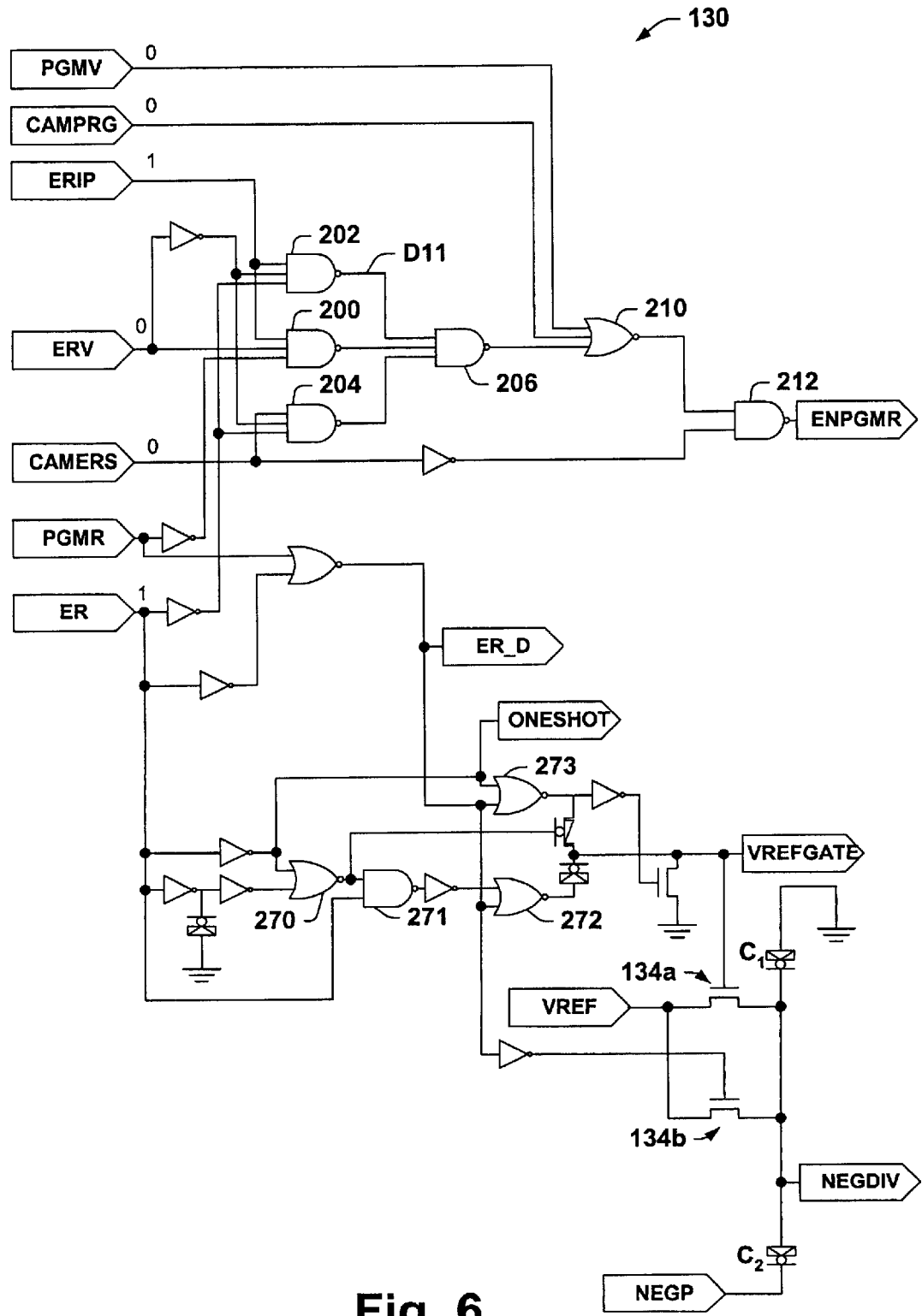
FIGS. 6 and 7 are schematic diagrams illustrating an exemplary circuit for pre-charging negative pump regulation capacitors according to another aspect of the invention.
Figure 7:
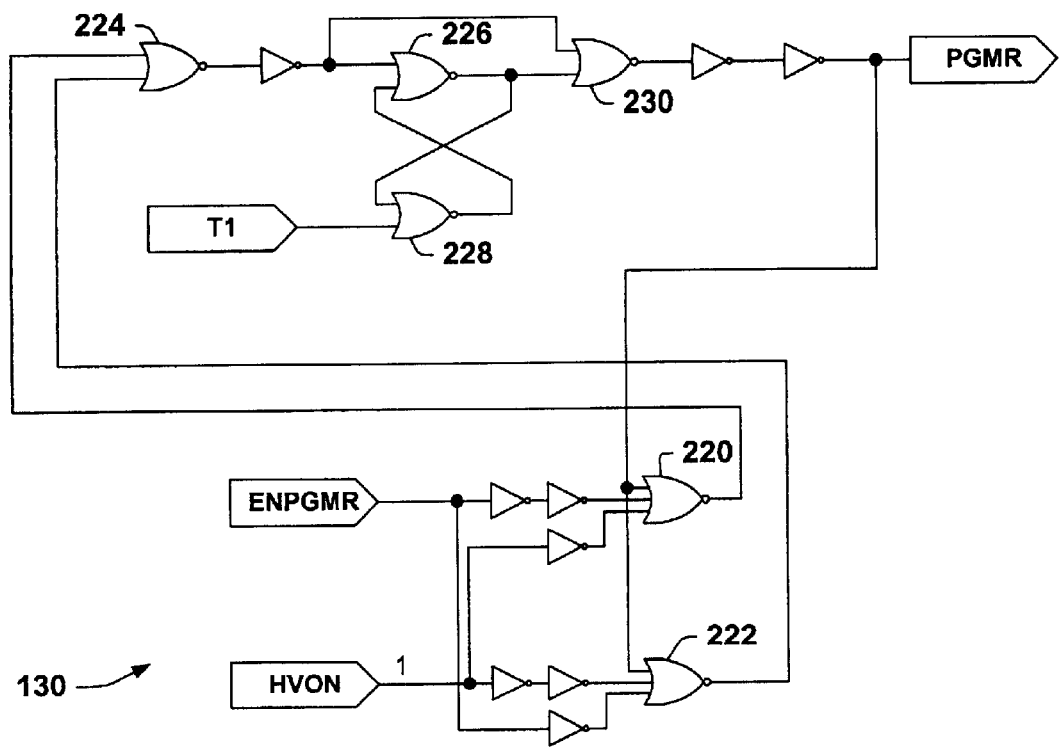
Figure 8:
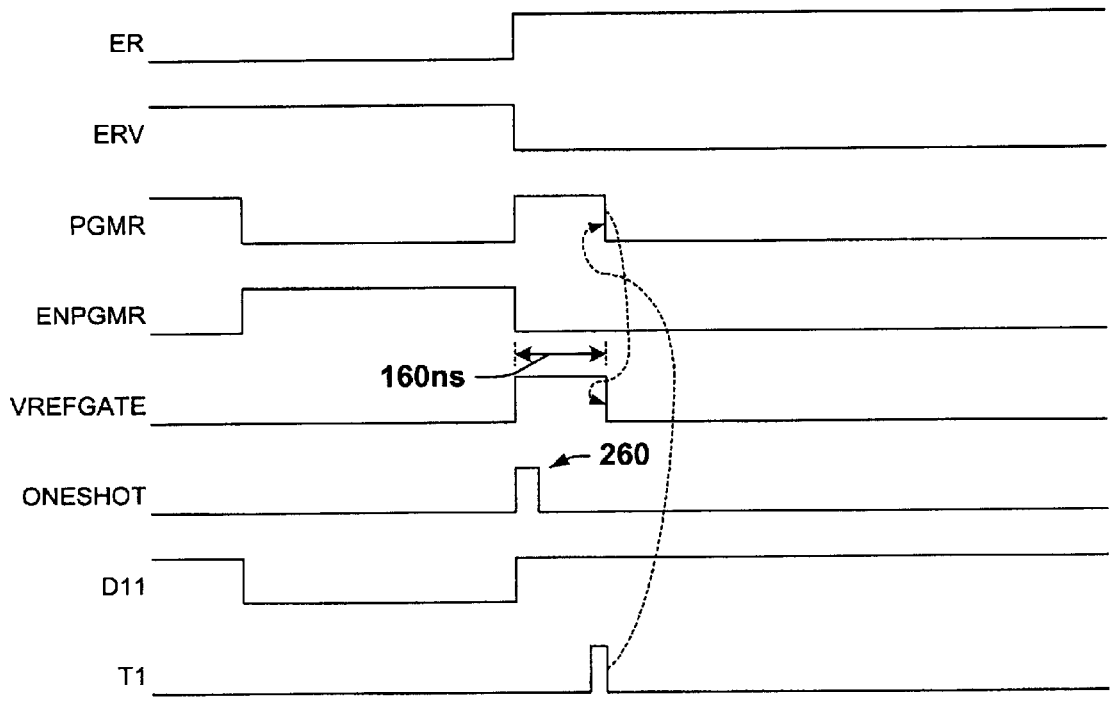
FIG. 8 is a timing diagram illustrating several signals associated with the circuit of FIGS. 6 and 7.

Referring now to FIGS. 6–8, an exemplary implementation of the pre-charge control circuit 130 is illustrated, along with exemplary timing signals (FIG. 8) in accordance with one or more aspects of the invention. An erase signal ER is set high (e.g., logic "1") at the beginning of an erase operation, causing node D11 to go high via gate 202. During erase operations, signals PGMV (Program Verify), CAMPRG (Cam Program), and CAMERS (Cam erase), and ERV (Erase Verify) are low (e.g., logic "0"), while signals ERIP (erase in progress), and HVON are high. Thus, the outputs of gates 200 and 204 are high, and gate 206 goes low. This causes signal ENPGMR to go low via gates 210 and 212.

As illustrated in FIG. 7, ENPGMR going low causes PGMR to go high via gates 220, 222, 224, 226, 228, and 230, and begins a timer circuit (not shown). PGMR going high turns on switch 134a via signal VREFGATE, connecting the divider capacitors $C_1$ and $C_2$ with the voltage reference VREF, for example, about 1.3 volts. Referring also to a timing diagram 150 of FIG. 8, about 160 ns after PGMR goes high, PGMR again goes low, causing a pulse signal ONESHOT 260 upon a high going pulse T1 from the timer circuit via gates 270–273 (FIG. 6). The low-going transition of PGMR causes ER_D to go high, resulting in VREFGATE going low, thereby disconnecting the reference VREF from the capacitors $C_1$ and $C_2$, once the time period (e.g., about 160 ns) is complete. This time period provides sufficient time for pre-charging of the negative regulation divider capacitors to allow proper regulation after switch 134a (FIG. 6) opens in the illustrated implementation of circuit 130.

Figure 9:
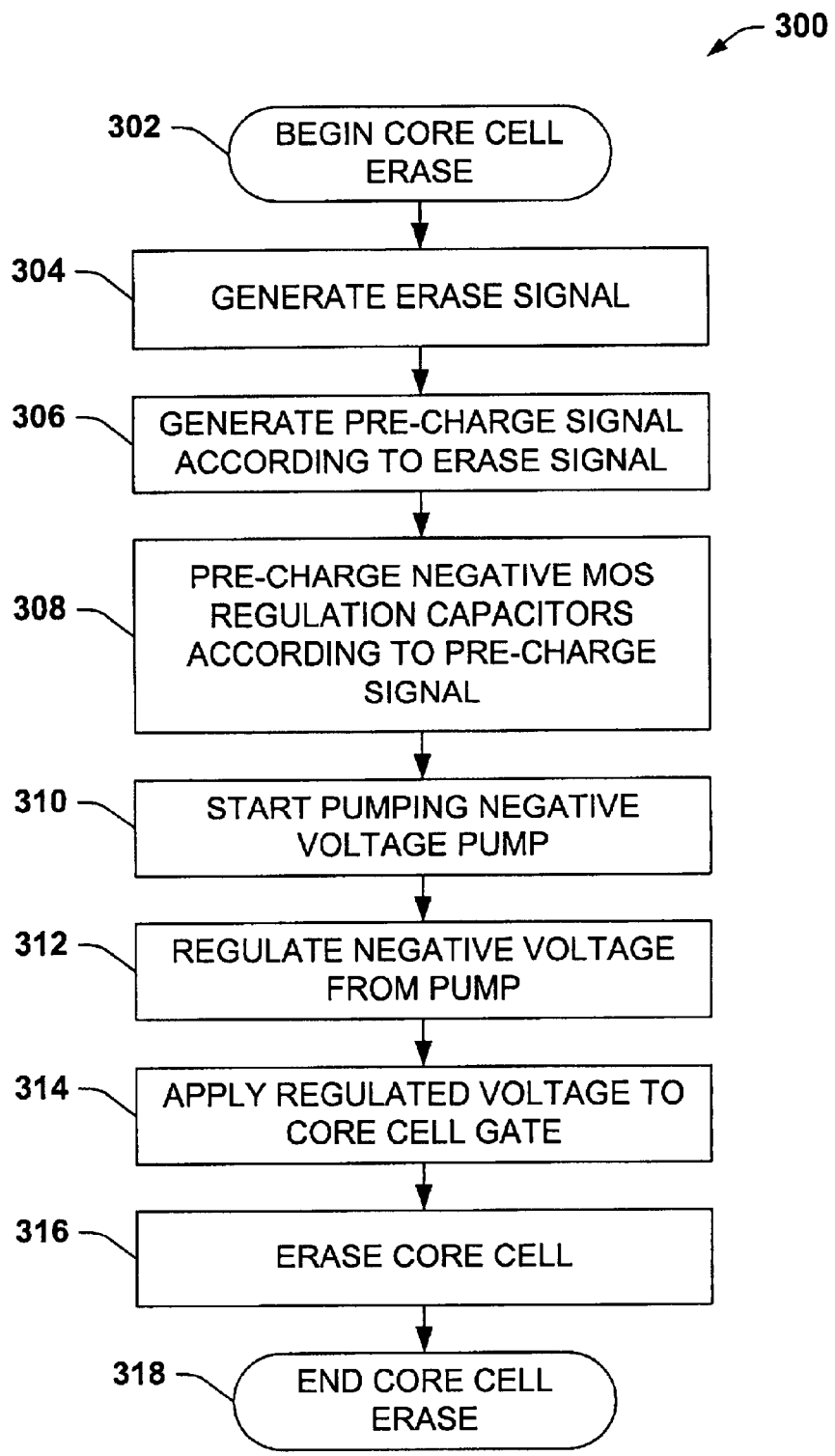
FIG. 9 is a flow diagram illustrating an exemplary method in accordance with another aspect of the invention.

Another aspect of the invention provides methods for erasing a core memory cell and for applying a negative gate voltage during erase operations in a flash or other memory device. One such method 300 is illustrated in FIG. 9 in accordance with the invention. While the exemplary method 300 is illustrated and described herein as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the method 300 may be implemented in association with the apparatus and systems illustrated and described herein as well as in association with other systems not illustrated.

Beginning at 302, the method 300 comprises generating an erase signal at 304, and generating a pre-charge signal at 306 according to the erase signal. For example, pre-charge control circuit 130 of FIG. 4 receives the erase control signal 120 and generates a pre-charge signal 132. Continuing at 308, the method 300 further comprises pre-charging one or more negative MOS regulation capacitors (e.g., MOS type capacitors $C_1$ and $C_2$) according to the pre-charge signal. Thereafter at 310, a negative voltage pump begins pumping and the negative voltage therefrom is regulated at 312. The regulated voltage is then applied to a core cell gate at 314 for erasure of the cell at 316 before the method 300 ends at 318.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of erasing a core memory cell using a negative gate voltage in a semiconductor memory device, comprising:
    generating an erase signal to begin an erase operation;
    generating a pre-charge signal according to the erase signal;
    pre-charging negative pump MOS regulation capacitors according to the pre-charge signal;
    regulating a negative pump voltage using the pre-charged negative pump MOS regulation capacitors; and
    erasing the core memory cell by applying a negative gate voltage to the core memory cell using the regulated negative pump voltage;
    wherein generating a pre-charge signal comprises generating a pulse, and wherein pre-charging negative pump MOS regulation capacitors comprises connecting a reference voltage to the negative pump MOS regulation capacitors according to the pulse.

2. The method of claim 1, wherein generating a pre-charge signal comprises generating a pulse having a pulse duration, and wherein pre-charging negative pump MOS regulation capacitors comprises connecting the reference voltage to the negative pump MOS regulation capacitors during the pulse duration.

3. The method of claim 2, wherein the negative pump MOS regulation capacitors comprise a capacitive voltage divider circuit having a first capacitance with a first terminal connected to a ground and a second terminal connected to a switch, and a second capacitance with a first terminal connected to the switch and a second terminal connected to a negative voltage pump, and wherein connecting the reference voltage to the negative pump MOS regulation capacitors during the pulse duration comprises connecting the reference voltage to the second terminal of the first capacitance and the first terminal of the second capacitance using the switch.

4. The method of claim 3, wherein connecting the reference voltage to the second terminal of the first capacitance and the first terminal of the second capacitance comprises closing the switch according to the pulse.

5. The method of claim 4, wherein the pulse duration is about 160 ns.

6. The method of claim 2, wherein the pulse duration is about 160 ns.

7. The method of claim 1, wherein the negative pump MOS regulation capacitors comprise a capacitive voltage divider circuit having a first capacitance with a first terminal connected to a ground and a second terminal connected to a switch, and a second capacitance with a first terminal connected to the switch and a second terminal connected to a negative voltage pump, and wherein pre-charging the negative pump MOS regulation capacitors comprises connecting the reference voltage to the second terminal of the first capacitance and the first terminal of the second capacitance using the switch.

8. A method of providing a negative gate voltage during a core memory cell erase operation, comprising:
    generating a pre-charge signal;
    pre-charge negative pump MOS regulation capacitors according to the pre-charge signal;
    regulating a negative pump voltage using the pre-charged negative pump MOS regulation capacitors; and
    providing a negative gate voltage to the core memory cell using the regulated negative pump voltage;
    wherein generating a pre-charge signal comprises generating a pulse, and wherein pre-charging negative pump MOS regulation capacitors comprises connecting a reference voltage to the negative pump MOS regulation capacitors according to the pulse.

9. The method of claim 8, wherein generating a pre-charge signal comprises generating a pulse having a pulse duration, and wherein pre-charging negative pump MOS regulation capacitors comprises connecting the reference voltage to the negative pump MOS regulation capacitors during the pulse duration.

10. The method of claim 9, wherein the negative pump MOS regulation capacitors comprise a capacitive voltage divider circuit having a first capacitance with a first terminal connected to a ground and a second terminal connected to a switch, and a second capacitance with a first terminal connected to the switch and a second terminal connected to a negative voltage pump, and wherein connecting the reference voltage to the negative pump MOS regulation capacitors during the pulse duration comprises connecting the reference voltage to the second terminal of the first capacitance and the first terminal of the second capacitance using the switch.

11. The method of claim 9, wherein the pulse duration is about 160 ns.

12. The method of claim 8, wherein the negative pump MOS regulation capacitors comprise a capacitive voltage divider circuit having a first capacitance with a first terminal connected to a ground and a second terminal connected to a switch, and a second capacitance with a first terminal connected to the switch and a second terminal connected to a negative voltage pump, and wherein pre-charging the negative pump MOS regulation capacitors comprises connecting the reference voltage to the second terminal of the first capacitance and the first terminal of the second capacitance using the switch.

13. An apparatus for pre-charging negative pump MOS regulation capacitors during a core cell erase operation in a memory device, comprising:
    a switch connected between a reference voltage and the negative pump MOS regulation capacitors; and
    a pre-charge control circuit providing a pre-charge pulse signal to the switch;
    wherein the switch is operative to selectively connect the reference voltage to the negative pump MOS regulation capacitors according to the pre-charge pulse signal.

14. The apparatus of claim 13, wherein the pre-charge control circuit receives an erase signal during the core cell erase operation, and generates the pre-charge signal for a time period, and wherein the switch connects the reference voltage to the negative pump MOS regulation capacitors during the time period.

15. The apparatus of claim 14, wherein the time period is about 160 ns.

16. The apparatus of claim 13, wherein the negative pump MOS regulation capacitors comprise a capacitive voltage divider circuit having a first capacitance with a first terminal connected to a ground and a second terminal connected to the switch, and a second capacitance with a first terminal connected to the switch and a second terminal connected to a negative voltage pump, and wherein the switch is operative to selectively pre-charge the negative pump MOS regulation capacitors by connecting the reference voltage to the second terminal of the first capacitance and the first terminal of the second capacitance according to the pre-charge pulse signal.

* * * * *